Figure 1:
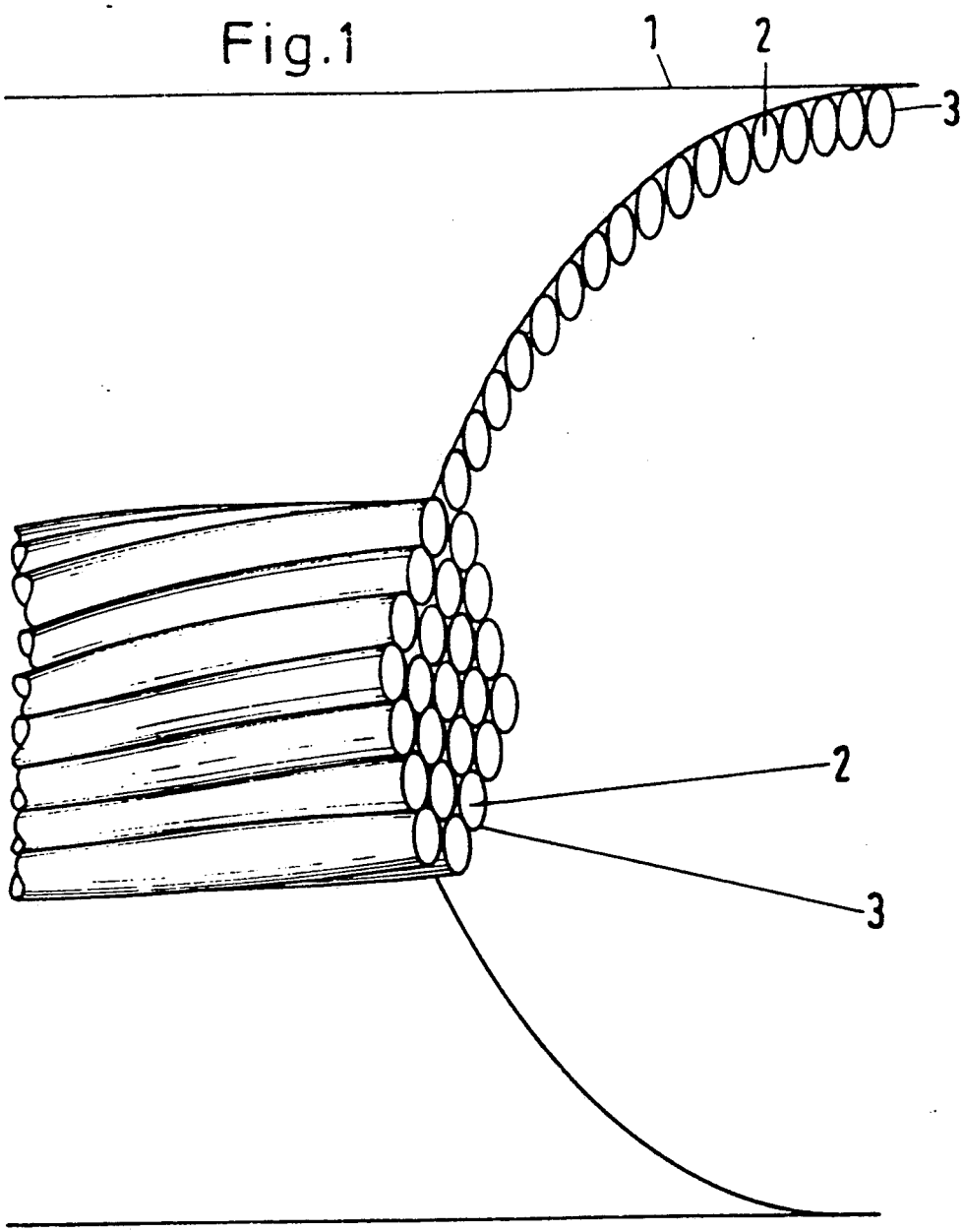

United States Patent [19]

Jahnke et al.

[11] Patent Number: 5,128,314
[45] Date of Patent: Jul. 7, 1992

[54] FIBER BUNDLE AND METHOD FOR PRODUCING THE SAME

[75] Inventors: Bernd Jahnke, Neckargemund; Franz-Josef Rohr, Absteinach; Franz Schmaderer, Plankstadt; Georg Wahl, Eppelheim; Andy Reich, Heidelberg, all of Fed. Rep. of Germany

[73] Assignee: Asea Brown Boveri Aktiengesellschaft, Mannheim, Fed. Rep. of Germany

[21] Appl. No.: 469,688

[22] Filed: Dec. 21, 1989

Related U.S. Application Data

[63] Continuation of Ser. No. 178,129, Apr. 6, 1988, abandoned.

[30] Foreign Application Priority Data

Apr. 8, 1987 [DE] Fed. Rep. of Germany ....... 3711842

[51] Int. Cl.$^5$ .............................................. B32B 9/00
[52] U.S. Cl. ............................... 505/1; 505/701; 505/702; 505/703; 505/704; 428/34.1; 428/446; 428/457; 428/698; 428/688; 428/696; 428/704; 428/930
[58] Field of Search .......... 505/1, 701.4; 428/34.1, 428/446, 457, 698, 688, 930, 704, 696

[56] References Cited

U.S. PATENT DOCUMENTS 4,585,696 4/1986 Dustmann et al. ............ 428/367 X

FOREIGN PATENT DOCUMENTS 0284489 9/1988 European Pat. Off. .

OTHER PUBLICATIONS

Japanese Journal of Applied Physics, vol. 27, No. 7, Jul., 1988, pp. L1297–1299, Hoshino et al.
Applied Physics Letts. vol. 52, No. 26, Jun. 27, 1988, Lee et al., pp. 2263–2265.
Microprobe Characterization of Sputtered Dish Tc Superconducting Films on Silicon, Lee et al., Apr. 1988, pp. 427–434.
Applied Physics Letters, 52(12), Mar. 21, 1988, Tachikawa, pp. 1011–1013.
J. Appl. Phys. 63(6), Mar. 15, 1988, pp. 2046–2053, Madakon et al.
Japanese Journal Appl. Phys., vol. 27, No. 2, pp. L214–L216, Feb. 1988, Hashimoto et al.
CRD GE, Jan. 1988, Thin Films of Y-Ba-Cu-O on Silicon ... Mogro-Campero et al.
Jap. Journ. Appl. Phys., vol. 26, No. 11, Nov. 1987, pp. L1842–L1849, Kanoto et al.
Jap. Journ. Appl. Phys., vol. 26, No. 5, May 1987, pp. L763–L765, Kosnuma et al.
Iwazumi et al., Prep. and Prop. of La Single Crystal, Jap. Jr. of App. Phys., vol. 26, No. 4, Apr. 1987, pp. L386–L387.
Jin et al., High Tc Superconductors, App. Phys. Lett., vol. 51, No. 3, Jul. 1987, 203–204.
Stanford Observer, May 1988.
Yurek et al., Synthesis of Superconducting Oxides, Mat. Res. Soc. Proc., vol. 99, 619–622.

Primary Examiner—Patrick J. Ryan
Attorney, Agent, or Firm—Herbert L. Lerner; Laurence A. Greenberg

[57] ABSTRACT

A superconducting fiber bundle includes carrier material formed by fibers of carbon, silicon carbide, steel, boron or glass. The fibers have a superconducting coating formed of a superconducting, non-metallic, inorganic material. The coating of the fibers is carried out from the liquid phase or the gas phase.

6 Claims, 1 Drawing Sheet

U.S. Patent     July 7, 1992     5,128,314

FIBER BUNDLE AND METHOD FOR PRODUCING THE SAME

This application is a continuation of application Ser. No. 178,129, filed Apr. 6, 1988, now abandoned.

The invention relates to a superconducting fiber bundle at least regionally formed of a superconducting material, having fibers serving as a carrier material.

Such superconducting fiber bundles are required in power engineering. They are especially necessary for further developments in the field of nuclear fusion, superconducting generators and in the construction of high-field magnets. In order to form superconducting fiber bundles, individual fibers formed of a metallic or non-metallic material are coated with a superconducting coating.

The journal "Physik", volume 64, pages 189 to 193, 1986 describes superconducting materials based on perovskites and oxides similar to perovskites with a high transition temperature.

It is accordingly an object of the invention to provide a fiber bundle and a method for producing the same, which overcome the hereinafore-mentioned disadvantages of the heretofore-known products and methods of this general type.

With the foregoing and other objects in view there is provided, in accordance with the invention, a superconducting fiber bundle at least regionally formed of a superconducting material, comprising fibers serving as a carrier material and having surfaces, and at least one coating formed of a superconducting, non-metallic, inorganic material disposed on the surfaces of the fibers.

In accordance with another feature of the invention, the at least one coating includes at least one material from the group consisting of oxides and/or mixed oxides of the elements of groups 2, 3, 4, 5, 8, 9, 10 and 11 of the periodic table of elements as defined by the new IUPAC recommendation.

In accordance with a further feature of the invention, the at least one coating includes at least one material from the group consisting of sulphides and/or fluorides.

In accordance with an added feature of the invention, the fibers are formed of a material from the group consisting of carbon, silicon carbide, metal, boron and glass, and the at least one coating is formed of a material from the group consisting of lanthanum strontium copper oxide and yttrium barium copper oxide.

With the objects of the invention in view, there is also provided a method for producing superconducting fiber bundles at least partially formed of a superconducting material, which comprises forming carrier fibers of a material from the group consisting of metallic and non-metallic material, and applying at least one coating formed of a superconducting, non-metallic, inorganic material to the surface of the carrier fibers.

In accordance with another mode of the invention, there is provided a method which comprises forming the carrier fibers of a material from the group consisting of carbon, silicon carbide, metal, boron and glass with a diameter of 5 to 7 $\mu$m, and forming the at least one coating from the group consisting of oxides and/or mixed oxides of the elements of groups 2, 3, 4, 5, 8, 9, 10 and 11 of the periodic table of elements as defined by the new IUPAC recommendation.

In accordance with a further mode of the invention, there is provided a method which comprises applying at least one intermediate layer formed of a material from the group consisting of ceramic material or metallic material directly to the surface of the fibers.

In accordance with an added mode of the invention, there is provided a method which comprises alternately applying a plurality of superconducting coatings and a plurality of intermediate layers formed of a material from the group consisting of ceramic material or metallic material to the surface of the fibers.

In accordance with an additional mode of the invention, there is provided a method of forming flexible superconducting fiber bundles which comprises forming the at least one coating of a material from the group consisting of lanthanum strontium copper oxide and yttrium barium copper oxide.

In accordance with a concomitant mode of the invention, there is provided a method which comprises applying the at least one coating with a thickness of 10 $\mu$m on the surface of several thousand fibers by chemical deposition from a liquid phase or a gas phase.

The coating of the fiber surfaces with superconducting material provides a fiber bundle in which the flexible properties of the fibrous carrier material remain intact. At the same time, ideal use can be made of the superconducting properties of the non-metallic inorganic materials which form the coating. Emphasis should be placed on a high transition temperature of over 33K as a particular advantage of the superconducting, inorganic, non-metallic materials. In order to construct the fiber bundle, fibers made of carbon, silicon carbide, boron, steel or glass are preferably used. The coating is carried out by chemical deposition from a liquid phase or from the gas phase. According to one embodiment of the fiber bundle, the surfaces of the fibers are first coated with an intermediate layer which need not necessarily have superconducting properties, in order to improve conductivity. Preferably, the intermediate layer is formed of at least one electrically conducting ceramic or metallic material. In another embodiment of the fiber bundle, such intermediate layers and superconducting materials are alternately applied to the surfaces of the fibers. It has been determined that lanthanum strontium copper oxide and yttrium barium copper oxide are particularly suitable as superconducting materials for the construction of the desired fiber bundles. Regardless of whether an intermediate layer is used or only superconducting materials are applied to the fibers, the applied layers always have a thickness which is less than or equal to 10 $\mu$um. The thickness of the fibers used is 5 to 7 $\mu$m.

Other features which are considered as characteristic for the invention are set forth in the appended claims.

Although the invention is illustrated and described herein as embodied in a fiber bundle and a method for producing the same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 2:
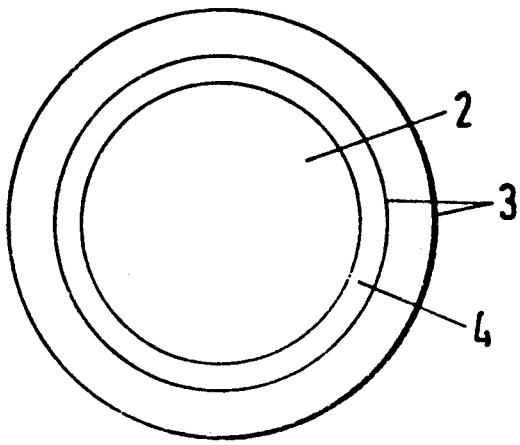

FIG. 1 is a fragmentary, diagrammatic, cross-sectional view of a fiber bundle according to the invention; and FIG. 2 is a cross-sectional view of an individual fiber.

Referring now to the figures of the drawings in detail and first, particularly, to FIG. 1 thereof, there is seen a subregion of a fiber bundle 1 in the vicinity of a section perpendicular to the longitudinal axis of the fiber bundle 1. As can be seen by reference to FIG. 1, the fiber bundle 1 is formed of several thousand fibers 2 which are held together in a known manner. The fibers 2 are produced, for example, from silicon carbide, steel, boron, carbon or glass. The fibers have a thickness of 5 to 7 μm. Other materials may also be used provided they fulfill the requested mechanical requirements and have the necessary flexibility. The fibers 2 serve as a tension-proof matrix and at the same time as a substrate for superconducting material which is applied to the entire surface of the fibers 2. A coating 3 is formed of oxides and/or mixed oxides of the elements of groups 2, 3, 4, 5, 8, 9, 10 and 11 of the periodic table of elements as defined by the new recommendation of IUPAC (The International Union of Pure and Applied Chemistry). Superconducting materials of lanthanum strontium copper oxide or yttrium barium copper oxide have proved to be particularly suitable for the coating. According to the invention, in order to improve the conductivity of the fibers 2, the coating 3 is not applied directly to the surface of the fibers 2. On the contrary, the surface of the fibers 2 is first coated with an intermediate layer 4 which is composed of an electrically conducting ceramic or metallic material.

FIG. 2 shows a section through a fiber 2, having a surface on which an intermediate layer 4 as described above is first applied. The actual superconducting coating 3 is then applied to the intermediate layer 4. According to the invention, there is a possibility of alternately applying intermediate layers 4 and coatings 3 to the surface of the fibers 2. The fibers 2 are coated either from the liquid phase or the gas phase. The components of the superconducting material may be provided in the form of an alcoholate solution in which the fibers are immersed for coating. An evaporation of the superconducting material and the coating from the gas phase is also possible.

The foregoing is a description corresponding in substance to German Application P 37 11 842.0, dated Apr. 8, 1987, the International priority of which is being claimed for the instant application, and which is hereby made part of this application. Any material discrepancies between the foregoing specification and the aforementioned corresponding German application are to be resolved in favor of the latter.

We claim:

1. Superconducting fiber bundle, comprising fibers of a material from the group consisting of silicon, carbide, metal, boron and glass having a diameter of substantially between 5 and 7 μm and serving as a carrier material, and a coating with a thickness of substantially 10 μm formed of a material from the group consisting of lanthanum-strontium-copper oxide and yttrium-barium-copper oxide disposed on said fibers.

2. Superconducting fiber bundle, comprising fibers of a material selected from the group consisting of silicon, carbide, metal, boron and glass serving as a carrier material having a diameter of substantially between 5 and 7 μm and having surfaces, and at least one coating formed of a superconducting material selected from the group consisting of lanthanum-strontium-copper oxide and yttrium-barium-copper oxide disposed on said surface of said fibers.

3. Superconducting fiber bundle, comprising fibers of a material selected from the group consisting of silicon, carbide, metal, boron and glass, serving as a carrier material having a diameter of substantially between 5 and 7 μm, and having surfaces, and at least one coating formed of a superconducting material disposed on said surfaces of said fibers, said at least one coating being formed of a material selected from the group consisting of lanthanum-strontium-copper-oxide, yttrium-barium-copper-oxide, oxides and mixed oxides of the elements of groups 2, 3, 4, 5, 8, 9, 10, and 11 of the periodic table of elements as defined by the new IUPAC recommendation.

4. Superconducting fiber bundle according to claim 3, wherein said at least one coating includes at least one material from the group consisting of superconducting sulphides and fluorides.

5. Superconducting fiber bundle according to claim 3, wherein said fibers are formed of a material from the group consisting of carbon, silicon carbide, metal, boron and glass, and said at least one coating is formed of a material from the group consisting of lanthanum strontium copper oxide and yttrium barium copper oxide.

6. Superconducting fiber bundle according to claim 3, wherein said fibers are formed of a material from the group consisting of carbon, silicon carbide, metal, boron and glass, and said at least one coating is formed of a material from the group consisting of lanthanum strontium copper oxide and yttrium barium copper oxide.

* * * * *